United States Patent
Pietsch et al.

(10) Patent No.: US 7,126,353 B2
(45) Date of Patent: Oct. 24, 2006

(54) METHOD AND CIRCUIT ARRANGEMENT FOR DETERMINING AN ELECTRIC MEASUREMENT VALUE FOR A RESISTANCE ELEMENT, PREFERABLY FOR DETERMINING AN ELECTRIC CURRENT THAT FLOWS THROUGH THE SAID RESISTANCE ELEMENT

(75) Inventors: Arnulf Pietsch, Regensburg (DE); Karlheinz Wamke, Obertraubling (DE); Gerhard Wild, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/544,016

(22) PCT Filed: Oct. 22, 2003

(86) PCT No.: PCT/DE03/03511

§ 371 (c)(1),
(2), (4) Date: Jul. 29, 2005

(87) PCT Pub. No.: WO2004/070401

PCT Pub. Date: Aug. 19, 2004

(65) Prior Publication Data

US 2006/0144165 A1 Jul. 6, 2006

(30) Foreign Application Priority Data

Jan. 29, 2003 (DE) ................. 103 03 409

(51) Int. Cl.
G01R 27/08 (2006.01)

(52) U.S. Cl. .................... 324/713; 324/691

(58) Field of Classification Search ............. 324/713, 324/691
See application file for complete search history.

(56) References Cited

U.S. PATENT DOCUMENTS

| | | | |
|---|---|---|---|
| 5,504,471 A | * | 4/1996 | Lund .................. 338/320 |
| 6,725,165 B1 | * | 4/2004 | Knox et al. ............. 702/42 |
| 6,853,306 B1 | | 2/2005 | Nitschke et al. |
| 2002/0021136 A1 | | 2/2002 | Pietsch et al. |
| 2003/0147270 A1 | * | 8/2003 | Baker .................. 365/148 |

FOREIGN PATENT DOCUMENTS

| | | |
|---|---|---|
| DE | 200 14 200 U1 | 1/2001 |
| DE | 199 10 194 C2 | 6/2001 |
| EP | 0 791 834 A2 | 8/1997 |
| WO | 99/53283 | 10/1999 |
| WO | 00/54064 | 9/2000 |

OTHER PUBLICATIONS

K. Billen, et al.: "Occupant Classification System for Smart Restraint Systems", I.E.E. International Electronics & Engineering, Luxembourg, I.E.E Automotive USA, Inc., Michigan, 1999-01-0761, pp. 33-38.

T. D'Alessio: "Measurement errors in the scanning of piezoresistive sensors arrays", Sensors and Actuators 72 (1999), Dipartimento di Ingegneria Meccanica e Industriale, Universita di Roma Tre, pp. 71-76.

U. Tietze, et al.: "Electronic Circuits", Design and Applications, Springer Verlag Berlin, Heidelberg, New York, 1991, pp. 450-455.

* cited by examiner

*Primary Examiner*—Vincent Q. Nguyen
*Assistant Examiner*—Amy He
(74) *Attorney, Agent, or Firm*—Laurence A. Greenber; Werner H. Stemer; Ralph E. Locher

(57) ABSTRACT

The invention relates to a method and a circuit arrangement for determining an electric measurement value for a resistance element (R22), preferably for determining an electric current that flows through said resistance element (R22), whereby the resistance element (R22) to be measured is interconnected to additional resistance elements within a resistance array (2) consisting of columns (CL1, CL2, CL3) and rows (R1, R2, R3) of resistance elements. According to the invention, the load of a basic load resistance element (R13), which is connected between the output of a measurement/supply unit (1) and the common ground terminal connection of the resistance array (2), is applied to the measurement voltage (MEAS). The measurement voltage (MEAS) is simultaneously connected to the input of an impedance transformer (OCL, OR), whose output is connected in a subsequent step to the resistance elements in the resistance array (2) that are not to be measured. This prevents a voltage differential at the input of the operation amplifier, eliminating to a great extent undesired signal fluctuations, which could falsify the measurement result.

10 Claims, 5 Drawing Sheets

METHOD AND CIRCUIT ARRANGEMENT FOR DETERMINING AN ELECTRIC MEASUREMENT VALUE FOR A RESISTANCE ELEMENT, PREFERABLY FOR DETERMINING AN ELECTRIC CURRENT THAT FLOWS THROUGH THE SAID RESISTANCE ELEMENT

BACKGROUND OF THE INVENTION

Field of the Invention

The invention relates to a method and a circuit arrangement for determining an electrical measurement value for a resistance element, preferably for determining an electrical current through the resistance element, with the resistance element to be measured being connected in a circuit along with further resistance elements within a resistance matrix consisting of columns and rows of resistance elements. The use of an arrangement of a number of resistance elements connected to each other in the form of a matrix is known from automotive technology for determining seat occupation in motor vehicles. In order for example to be able to efficiently adapt the triggering of a means of restraining a seat occupant to the seat occupation in a motor vehicle, pressure-dependent resistance elements are arranged over the surface of the vehicle seat and interconnected in a matrix-type arrangement so that a pressure-dependent change to the resistance values of the resistance elements provides information about the weight and the weight distribution of the occupant of a seat and thereby in the end enables feedback to be obtained about their sitting position and body dimensions.

Such arrangements of resistors as a resistance matrix embodied as a sensor mat are known from the German Utility Model DE 200 14 200 U1 and from the article entitled "Occupant Classification System for Smart Restraint System" published by the Society of Automotive Engineers Inc. in 1999, BNSDOCID XP-002184965.

The change in the resistance values of the resistance elements of a sensor mat used individually as sensor elements under the influence of a weight force is usually determined via a change in the respective current consumption. This is done by applying a voltage to the input of the resistance element to be measured while its output is switched to the ground connection terminal of the resistance matrix. The current flowing in this way through the resistance element to be measured is measured by a measurement unit and then acts as a measure for the resistance of the resistance element to be measured at a predetermined voltage and thereby as a measure of the weight force being applied to the resistance element. To prevent interference currents which could flow out during the measurement of a resistance element to other resistance elements not measured at this point and disrupt the measurement in this way, all columns and rows of resistance elements not available for measurement and in this respect not needed are connected both on the input side and on the output side to a voltage which is as equal as possible in size, if possible to the same measurement voltage which is present on the input side at the resistance element to be measured. However, so that no current is drawn from the associated measurement voltage source over and above the current through the resistance element to be measured, power is supplied to the rows and columns of the resistance matrix not needed through impedance transformers which are connected between the measurement voltage and the unneeded rows and columns of the resistance matrix. The outputs of the impedance transformers in this case mostly have their own current driver stages, known as pull transistors, which output power to the rows and columns of the resistance matrix independently of the measurement power source, and thus does not falsify the power measurement at the measurement voltage source. Suitable impedance transformers are known from the appropriate technical literature, for example from the manual of "Electronic Circuits", U. Tietze, Ch. Schenk, Springer-Verlag Berlin, Heidelberg 1991, Page 454, FIG. 16.19. This shows an operational amplifier as an impedance transformer of which the inverting input is connected in a feedback arrangement with its output.

FIG. 1 shows a schematic diagram of this type of measurement arrangement during the measurement of a resistance element (R22) of a resistance matrix (2). The reference symbols of FIG. 1 correspond to the reference symbols used in the description of the subsequent Figures. To illustrate the technical problem more clearly only some of the switch arrangements (SCL2, SCL3, SR1, SR3) not needed at the time the resistance element (R22) is measured are shown in FIG. 1. It should also be pointed out that a number of individual switches of a circuit arrangement are indicated by the same reference symbol and that the electrical data connections shown between the individual switches and electronic device elements shown only exist for the switching state of the switch arrangements (SCL2, SCL3, SR1, SR3) shown.

The resistance elements (R22, R23, R33) shown in FIG. 1 are connected via capacitors (C22, C23, C33') to the ground terminal connection of the circuit arrangement. Such capacitors can for example be parasitic capacitors of the circuit arrangement or also deliberately incorporated interference suppression capacitors to protect against electromagnetic disturbance in the circuit arrangement. The driver stages at the output of the two impedance transformers shown (OCL and OR) which are electrically independent of a measurement voltage (MEAS) supplied by a measurement/supply unit (1) charge the capacitors (C23, C33') connected to them up to a voltage level which can be greater than the measurement voltage (MEAS). When the measurement voltage (MEAS) is connected to the inputs of the impedance transformers (OCL, OR) the effect of these capacitors (C23, C33') charged to a higher potential can produce oscillations at the signal outputs of the impedance transformers (OCL, OR) which can severely disturb the measured current flow through the resistance element (R22) to be measured during an initial setting time. The voltage difference between the inputs of the impedance transformers (OCL, OR) and the charged capacitors (C23, C33') is additionally increased if the resistance element (R22) to be measured is very low-resistance, for example if no weight is acting on the resistance element (R22) and the measurement voltage (MEAS) is therefore lowered under the influence of the internal resistance of the measurement/supply unit (1).

The oscillations produced at the signal output of the impedance transformers (OCL and OR) can result in the worst case in an incorrect measurement of the current flow through the resistance element (R22) to be measured, so the weight acting on the resistance element (R22) to be measured is determined incorrectly. Above all, if such incorrect measurements occur at a number of resistance elements of the resistance matrix (2), this can lead to a wrongly determined weight or a falsified weight profile of a vehicle occupant.

SUMMARY OF THE INVENTION

The object of the present invention is therefore to specify a method and an appropriate device in which the occurrence of disruptive influences during the measurement of a resistance element of a resistance matrix, for example of signal oscillations, is markedly reduced.

As regards making the explanations given below in this document easier to understand, one connecting side of a resistance element will be designated the input side in each case and the corresponding other connection side of the same resistance element the output side.

With the method for determining an electrical measurement value for a resistance element, a basic load resistance element is connected before each measurement of an individual resistance element on the input side, connected together with its column within the resistance matrix to the measurement voltage and on the output side, together with its row within the resistance matrix, connected to the ground terminal of the resistance matrix. Simultaneously or shortly thereafter a common reference voltage line of the resistance matrix is connected to the measurement voltage present on the input side so that the measurement voltage serves as a reference voltage, from which first and second reference voltages for all columns and rows of resistance elements not to be measured are derived. Only then are all further resistance elements of the resistance matrix together with their columns connected on the input side to the first reference voltage and on the output side together with their rows to the second reference voltage. Only now will the measurement voltage be applied on the input side to the resistance element to be measured together with its columns and connected on the output side together with its rows to the ground terminal of the resistance matrix. Subsequently the basic load resistance element is disconnected again from the measurement voltage and from the ground connection and like at this point all further resistance elements, connected together with its column on the input side to the first reference voltage and on the output side to the second reference voltage, at which point the measurement of the measurement value for the resistance element to be measured can actually take place, preferably by the current being determined which flows from the measurement voltage through the resistance element to be measured to the ground connection.

The initial connection of the basic load resistance element prevents the measurement voltage being lowered by the effect of the internal resistance of a measurement/supply unit and thereby voltage differences being able to arise between the inputs of impedance transformers which are connected to the measurement/supply unit and capacitors at its outputs. Only the subsequent connection of the non-measured rows and columns of resistance elements to the first or second reference voltage at the outputs of the impedance transformers also prevents the capacitors at the outputs of the impedance transformers charging up to above the voltage level of the measurement voltage. The two measures together consequently prevent too great voltage differences being able to arise between the inputs of the impedance transformers and these capacitors. Oscillations of the first and second reference voltages of the columns or rows not available for measurement are largely avoided in this way.

Advantageously the first and second reference voltages for the columns or rows of resistance elements respectively are generated at an output of an impedance transformer of which the input is connected to the common reference voltage line. This ensures that the resistance elements in the rows and columns not being measured at the time are held both on the input side and on the output side to a voltage potential which is as equal as possible to the measurement voltage across the resistance element to be measured and at the same time almost no measurement-falsifying current flows into resistance elements other than the resistance element of a column or row to be measured.

Also advantageously the first reference voltage for the non-measured columns of resistance elements and the second reference voltage for the non-measured rows of resistance elements is created by a different impedance transformer in each case. Driver stages at the signal outputs of the impedance transformer can thereby be deigned for lower power which enables low-cost conventional technologies to be used.

If a method with the features already outlined is used for measurement of each individual resistance element of a resistance matrix in turn, an almost error-free measurement can be made possible for each resistance element of a resistance matrix.

The method of operation of the invention and an exemplary embodiment for the invention are presented below. The Figs. show:

DESCRIPTION OF THE PREFERRED EMBODIMENTS

Figure 1:
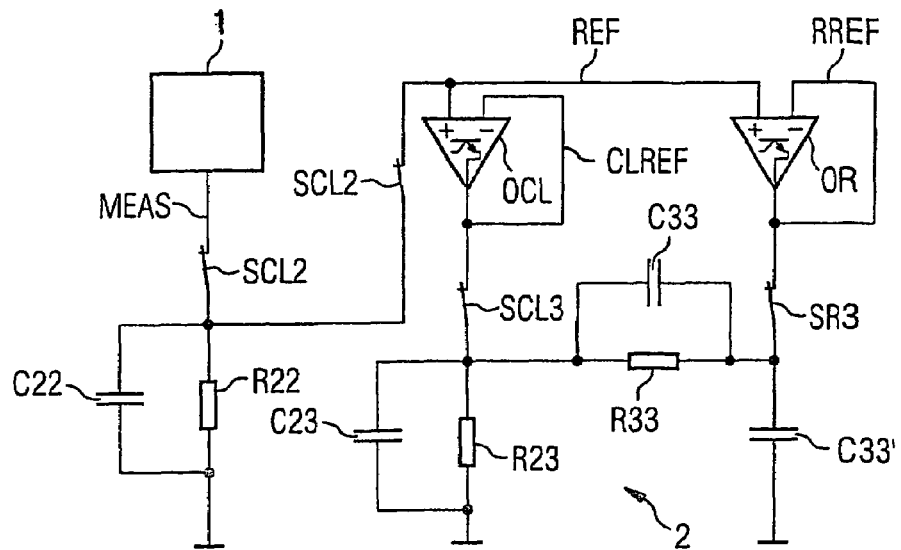
FIG. 1 a schematic diagram of the measurement arrangement for measuring a resistance element R22 within a resistance matrix 2 according to the prior art, FIG. 2 the schematic diagram from FIG. 1 with a basic load resistance element R13 which can be connected in accordance with the invention and FIGS. 3 to 6 a schematic diagram of the individual switching processes during a procedural sequence in accordance with the invention based on a circuit arrangement in accordance with the invention for measurement of a resistance element R22 with the aid of a basic load resistance element R13.
Figure 2:
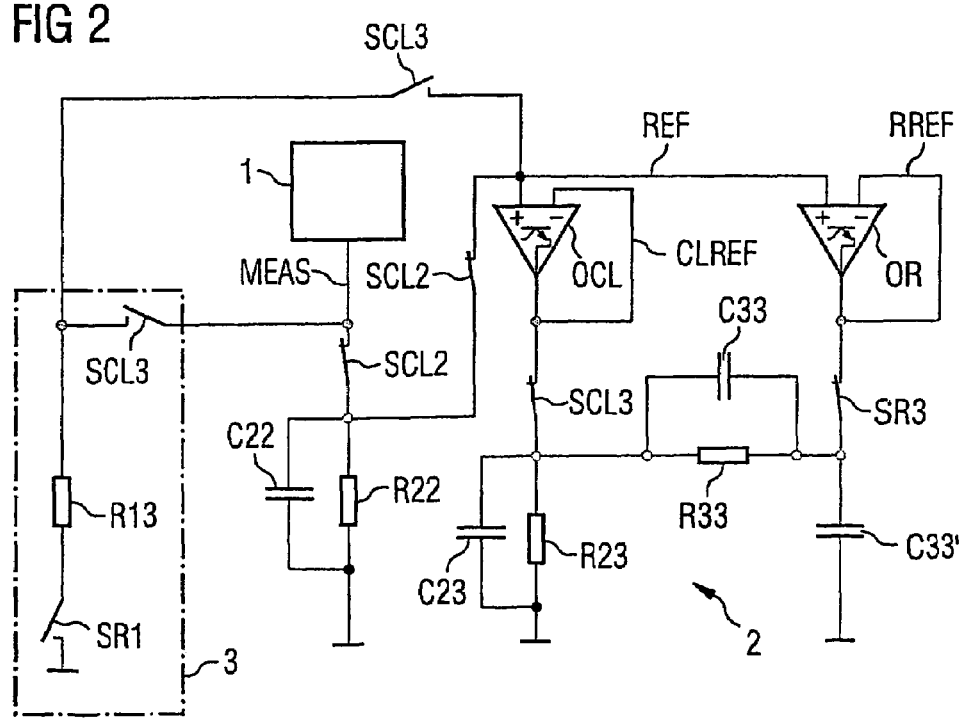

The circuit arrangement shown in the FIGS. 3 to 6 in each case features resistance elements R11, R12 and R13 in a first row R1, resistance elements R21, R22 and R23 in a second row R2 and resistance elements R32 and R33 in a third row R3. The resistance elements combined into a row in each case are electrically interconnected. In the circuit arrangement shown basically all resistance elements of a row are interconnected on the output side. In the same way the resistance elements R11 and R21 are combined into a first column CL1, the resistance elements R12, R22 and R32 into a second column CL2 and the resistance elements R13, R23 and R33 into a third column CL3. Similarly to the wiring of the resistance elements within the three rows R1, R2 and R3, the inputs of the resistance elements of a column are electrically connected to each other in each case.

Also shown are three switch arrangements SCL1, SCL2 and SCL3, consisting of four individual, independently swichable switches, for example 4 switching transistors. Each of the three switch arrangements SCL1, SCL2 and SCL3 can simultaneously switch one of the three columns CL1, CL2 CL3 of the resistance matrix shown to one or more of the following connections:

1. a common reference voltage line REF,
2. a measurement voltage MEAS,
3. a first reference voltage CLREF and
4. a common ground terminal of the circuit arrangement.

The first reference voltage CLREF is provided at the output of a first impedance transformer OCL. As shown in FIGS. 3 to 6, this is for example embodied as a first operational amplifier OCL of which the non-inverting input is connected to the common reference voltage line REF and of which the output is connected to the inverting input of the first operational amplifier OCL in a feedback arrangement. This impedance transformer circuit ensures that the first reference voltage potential is always regulated to the voltage present at the common reference voltage line REF.

The switch arrangements SR1, SR2 and SR3, each consisting of four switches able to be switched independently, for example 4 switching transistors, ensure that the rows R1, R2 and R3 can also be switched to one or more of the following connections, namely:

1. the common reference voltage line REF,
2. the measurement voltage MEAS,
3. a second reference voltage RREF and
4. the common ground of the circuit arrangement.

A second impedance transformer OR generates the second reference voltage RREF in this case and is for example embodied in same way as the first impedance transformer OCL: The common reference voltage line REF is fed to the non-inverting input of a second operational amplifier OR of the resistance matrix 2 while its output signal is fed in a feedback arrangement to the inverting input of the second operational amplifier OR. In a similar way to that in which the first operational amplifier OCL functions, the second operational amplifier OR also regulates the second reference voltage RREF to the potential of the voltage REF present at the common reference voltage line.

The measurement voltage MEAS is fed to the circuit arrangement of a measurement/supply unit 1, in which the current consumed by the resistance matrix can simultaneously be measured.

The way in which the individual circuit elements are arranged spatially is of no importance either for the inventive method or for the circuit arrangement suitable for it. For example, with the circuit arrangements of FIGS. 3 to 6 shown, the impedance transformers OCL and OR, the measurement/supply unit and the switch arrangements of columns CL1 to CL3 and rows R1 to R3 can be arranged together within a component, for example within a semiconductor ASIC.

The resistance elements R11 to R33 are largely arranged as pressure-dependent sensor elements of a sensor seat mat on the surface of a vehicle seat. For measurement reasons which are not to be explained in any greater detail here there are however also resistance elements arranged on the sensor mat here, of which the output signal does not change under the effect of a weight force. Such resistance elements are therefore also not necessarily arranged on the sensor seat mat but can also be arranged on a circuit board which is located away from the sensor seat mat. A sole decisive factor in whether resistance elements belong to the circuit arrangement shown is the wiring within the resistance matrix 2 of the circuit arrangement shown. The basic load resistance element R13 is for example preferably a pressure-independent resistance element R13 of a board and is still arranged within the resistance matrix 2 and shown correspondingly in FIGS. 3 to 6.

Furthermore the circuit arrangement shown is in no way restricted to the three rows R1, R2 and R3 and three columns CL1, CL2 and CL3 shown in the diagram. Any number of rows R and columns CL can be arranged within the resistance matrix 2.

With reference to the FIGS. 3 to 6 the individual switching states of the switch arrangements SCL1 to SCL3 and SR1 to SR3 are explained for the individual procedural steps, and indeed are explained with reference to an example of a measurement of a current through the resistance element R22.

Figure 3:
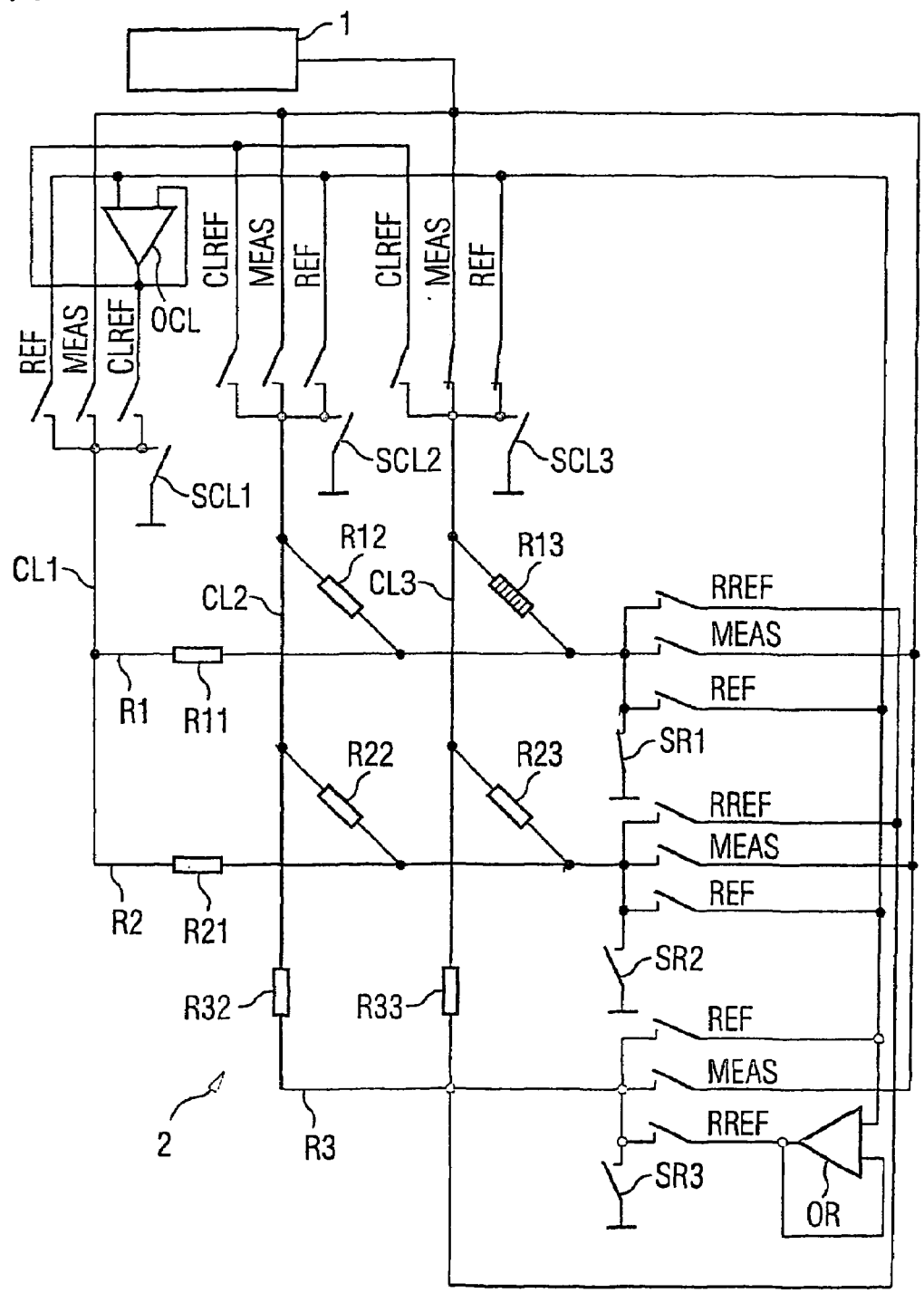
FIGS. 3 to 6 each show the same circuit arrangement to execute a method in accordance with the invention, with each of the FIGS. 3 to 6 showing a relevant switch position in accordance with one of the claimed procedural steps.

FIG. 3 shows the first procedural step. Initially the basic load resistance element R13 of the column CL3 is connected on the input side both to the measurement voltage MEAS and also to the reference voltage line REF. The switch arrangement SR1 is simultaneously connected to the ground terminal. All further switch arrangements SCL1, SCL2, SR2 and SR3 are for example opened so that they do not conduct at this point.

Figure 4:
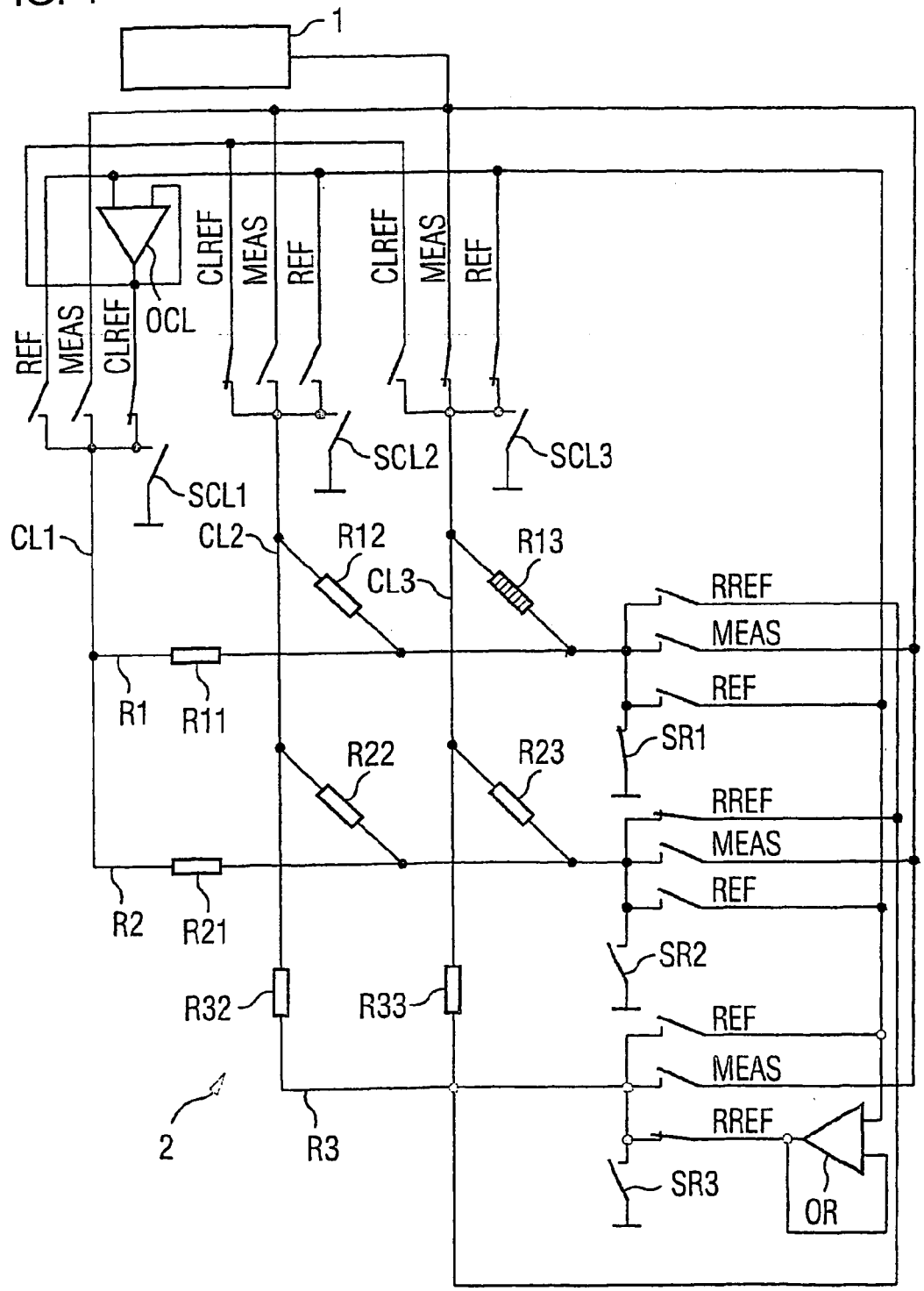

FIG. 4 shows the second procedural step. The columns CL1 and CL2 not available for measurement and in this sense not present are connected via the switch arrangements SCL1 or SCL2 to the first reference voltage CLREF and thereby on the input side also the resistance elements R11, R21, R12, R22 and R32. Via the switch arrangements SR2 and SR3 the rows R2 or R3 not available for measurement and in this sense not needed are connected to the second reference voltage RREF and consequently also the outputs of the resistors R21, R22, R23, R32 and R33 which are combined in the two rows R2 and R3.

Figure 5:
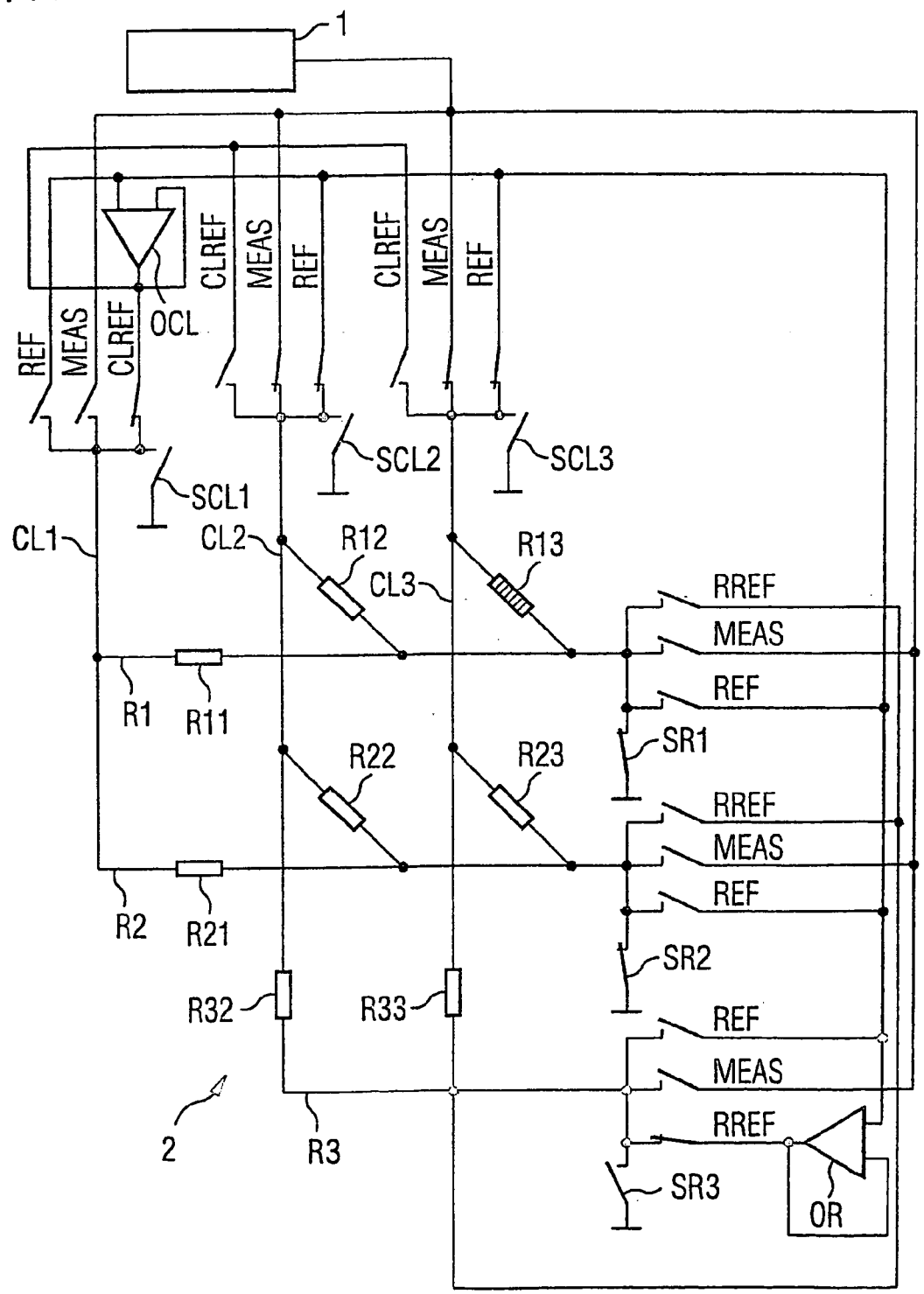

In FIG. 5 the column CL2 of the resistance element R22 to be measured is initially disconnected from the existing electrical data connections and then connected both to the measurement voltage MEAS, and also to the common reference voltage line REF, with the row R2 simultaneously being connected via the switch arrangement SR2 to the common ground terminal of the resistance matrix 2.

Figure 6:
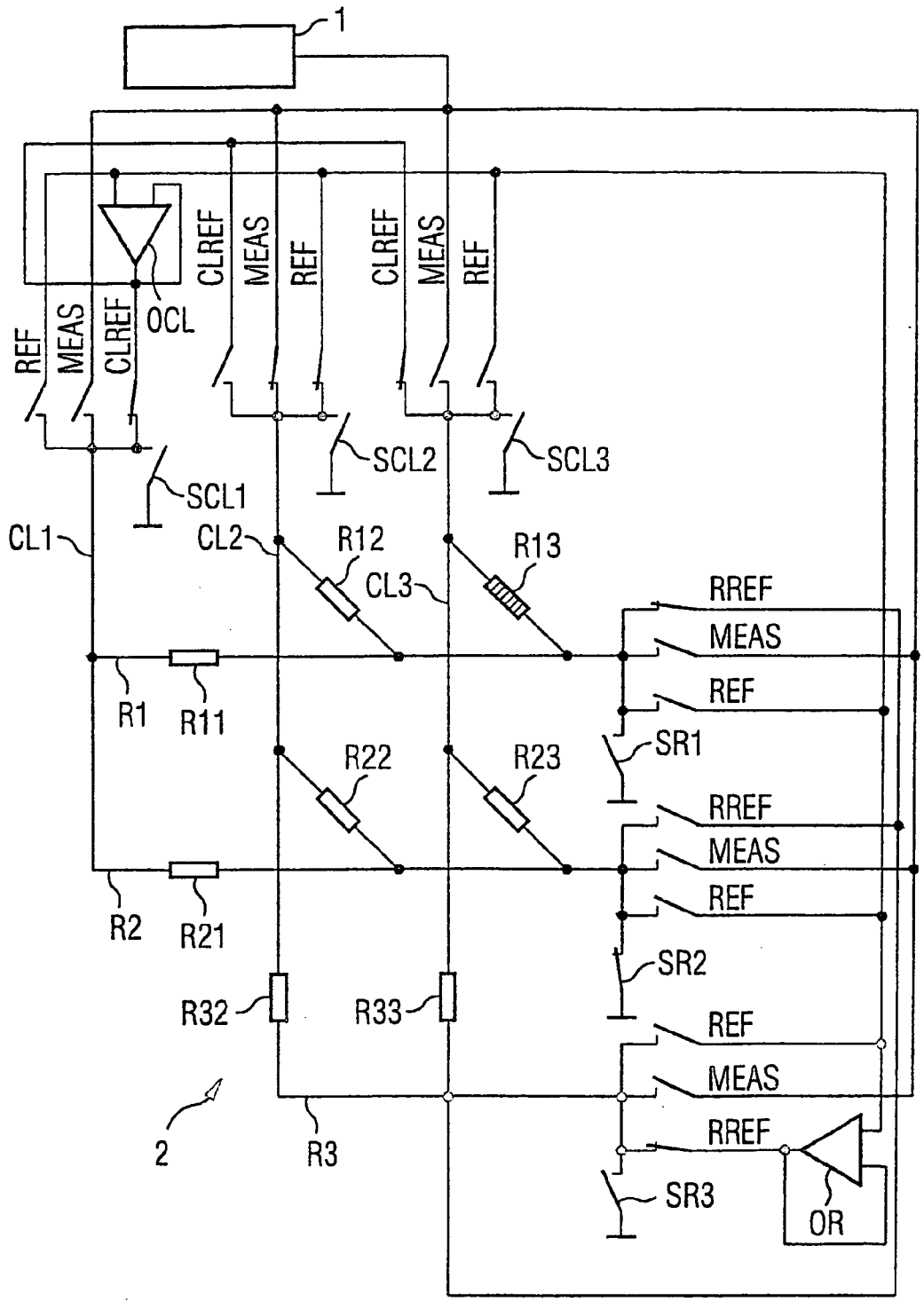

In FIG. 6 the existing electrical connections of the basic load resistance element R13 are initially shown disconnected. Then the basic load resistance element R13 is switched on the input side together with its column CL3 to the first reference voltage CLREF. On the output side the basic load resistance element R13 is connected via the switch arrangement SR1 together with the entire row R1 to the second reference voltage RREF. Now only a measurement current flows from the measurement/supply unit 1 through the resistance element R22 to be measured to the connected ground terminal of the resistance matrix 2.

The measurement of the current in the measurement/supply unit 1 can in this case be undertaken directly, but can also be undertaken as an indirect measurement of a measured electrical value derived from the current, for example of a voltage drop at a resistor suitable for the purpose within the measurement/supply unit 1.

In the same way as the current measurement has been described for the resistor R22 each resistor of the resistance matrix can be measured in turn.

We claim:

1. A method of determining an electrical measurement value for a resistance element, wherein the resistance element to be measured is connected in a circuit with further resistance elements within a resistance matrix having at least one row with a number of columns of resistance elements, the method which comprises the following steps, to be carried out in sequence:

connecting an input side of a basic load resistance element, together with a corresponding column within the resistance matrix, to a measurement/supply unit and also simultaneously or subsequently to a common reference voltage line, to thereby form a common reference voltage from the measurement voltage of the measurement/supply unit, and connecting an output side of the basic load resistance element, together with a corresponding row within the resistance matrix, to a ground connection of the resistance matrix;

connecting the input sides of all further resistance elements together with the respective columns to a first reference voltage and connecting an output side thereof, together with the respective rows, to a second reference voltage;

disconnecting the resistance element to be measured from all electrical connections, connecting an input side of the resistance element, together with the respective column to the measurement/supply unit and simultaneously or subsequently to the common reference voltage line, and connecting an output side of the resistance element, together with the respective row, to the ground connection of the resistance matrix;

disconnecting the basic load resistance element and connecting the input side of the basic load resistance element, together with the respective column to the first reference voltage and connecting the output side of the basic load resistance element, together with the respective row, to the second reference voltage; and determining with measurement/supply unit the electrical measurement value for the resistance element to be measured.

2. The method according to claim 1, which comprises determining an electrical current through the resistance element, by measuring the electrical current flowing from the measurement/supply unit through the resistance element to be measured to the ground connection of the resistance matrix.

3. The method according to claim 1, wherein the resistance matrix forms part of a device for detecting a seat occupancy in a motor vehicle, with a few of the resistance elements arranged flush on the seating surface of a motor vehicle seat, and a resistance value thereof is influenced by a weight force operating thereon.

4. The method according to claim 1, which comprises providing the first reference voltage and the second reference voltage at an output of an impedance transformer, wherein an input of the impedance transformer is connected to the common reference voltage line.

5. The method according to claim 4, which comprises generating the first reference voltage with a first impedance transformer and generating the second reference voltage with a second impedance transformer.

6. A method for determining one electrical measurement value for each of a plurality of resistance elements, which comprises measuring each of the measurement values with the method according to claim 1.

7. A method for determining an electrical current through each of a plurality of resistance elements of a resistance matrix by determining the electrical current with the method according to claim 1.

8. A circuit configuration for determining an electrical measurement value for a resistance element, wherein the resistance element to be measured is connected in a circuit together with further resistance elements within a resistance matrix formed with at least one row, with a plurality of columns of resistance elements, the circuit configuration comprising:

a measurement/supply unit connectible to each column and to each row of the resistance matrix;

at least one impedance transformer having an input connected to said measurement/supply unit;

a basic load resistance element connectible between said measurement/supply unit and common ground of the resistance matrix; and said at least one impedance transformer having an output connectible with at least one column or at least one row;

wherein the circuit configuration is configured to perform the method for determining an electrical measurement value in accordance with claim 1.

9. The circuit configuration according to claim 8 configured to determine an electrical current through the resistance element.

10. The circuit configuration according to claim 8 in combination with a device for detecting a seat occupancy in a motor vehicle wherein a plurality of resistance elements are distributed about a seating surface of a motor vehicle seat and change their resistance value through a weight force operating thereon.

* * * * *